United States Patent [19]

Dyer

[11] 4,002,523
[45] Jan. 11, 1977

[54] DISLOCATION-FREE GROWTH OF SILICON SEMICONDUCTOR CRYSTALS WITH <110> ORIENTATION

[76] Inventor: Lawrence Dean Dyer, Dallas, Tex.

[73] Assignee: Texas Instruments Incorporated, Dallas, Tex.

[22] Filed: May 19, 1975

[21] Appl. No.: 579,297

Related U.S. Application Data

[63] Continuation of Ser. No. 396,654, Sept. 12, 1973, abandoned.

[52] U.S. Cl. .................. 156/617 SP; 156/618; 23/273 SP
[51] Int. Cl.² ................ B01J 17/18; C01B 33/02
[58] Field of Search ........... 156/618, 620, 617 SP; 23/273 SP, 273 Z

[56] References Cited

UNITED STATES PATENTS

| 2,985,519 | 5/1961 | Kelemer | 23/273 SP |
| 3,096,158 | 7/1963 | Gaule | 23/273 SP |
| 3,414,388 | 12/1968 | Keller | 156/618 |
| 3,498,846 | 3/1970 | Keller | 23/273 Z |
| 3,561,931 | 2/1971 | Vogel | 156/618 |
| 3,685,973 | 8/1972 | Keller | 156/618 |

FOREIGN PATENTS OR APPLICATIONS

| 1,129,488 | 10/1968 | United Kingdom | 156/620 |
| 1,216,522 | 12/1970 | United Kingdom | 156/620 |
| 915,908 | 1/1963 | United Kingdom | 156/617 SP |

OTHER PUBLICATIONS

Dash, J. of App. Phy., vol. 30, No. 4, Apr. 1959, pp. 459–474 (note 474 col. 2).

*Primary Examiner*—Stephen J. Emery
*Attorney, Agent, or Firm*—Harold Levine; James T. Comfort; Gary C. Honeycutt

[57] ABSTRACT

The disclosure relates to the growth of semiconductor single crystals, i.e., either by the pedestal method or by the Czochralski method, free from dislocations, particularly in the difficult directions of growth, such as <110>. The method causes dislocations parallel to the growth axis to grow away from the axis under the influence of a changing crystal diameter. The thickness of the stem portion of the crystal is controlled so that it has first a long thin portion to get rid of dislocations on the {111} planes that are inclined to the <110> axis and then a portion in which the residual dislocations are permitted to terminate at the surface. The latter portion may be generated in several ways. One way is to follow the long narrow diameter portion with a section of substantially larger diameter followed by a further narrow diameter portion. This combination is repeated one or more times to insure freedom from dislocations in the resulting crystal. By having the alternate thin and thick regions, the dislocations are gradually moved away from the axis of the crystal and toward the periphery where they will have a greater probability of terminating on a surface, thereby removing the dislocations.

2 Claims, 3 Drawing Figures

DISLOCATION-FREE GROWTH OF SILICON SEMICONDUCTOR CRYSTALS WITH <110> ORIENTATION

This is a continuation of application Ser. No. 396,654, filed Sept. 12, 1973, now abandoned.

This invention relates to the growth of semiconductor single crystals, either by the pedestal method or by the Czochralski method, and more particularly to a method of increasing the yield and certainty of growing a dislocation-free crystal with <110> or any other difficult-to-grow orientation. In the following discussion, silicon crystals of the <110> orientation are used for illustration.

Silicon slices of {110} orientation have inherent attractive features for semiconductor device design. For example, ion implantation techniques for making semiconductor devices can utilize the fact that the ion penetration is more effective in the <110> direction in the diamond lattice. Also, the {110} orientation provides superior device packing densities as compared with the {100} and {111} orientations. Furthermore, the {110} orientation possesses boron diffusion characteristics that are the same as on the {111} orientation. Though these advantages of <110> crystals for various purposes have been known, it is also necessary in many applications that the crystal be free from dislocations. This has presented a problem in the prior art because the <110> crystals have been plagued by poor yields due to such dislocations, there being a factor of about 25 to 1 in the yield between the <111> or <100> orientations as compared with the <110> orientation crystals. These poor yields of the <110> crystals are believed to be caused by the propagation of the dislocations parallel to the <110> growth axis from the seed through the stem and into the main body of the crystal where the dislocations can multiply to unacceptable densities. Prior art methods of removal of dislocations from silicon crystals, such as those described in U.S. Pat. Nos. 3,275,417 and 3,397,042, do not remove all of the dislocations. Thus, although dislocation-free growth of <110> oriented silicon crystals is taught and accomplished in the prior art, the yield is low and is not as predictable as in the case of <111> and <100> growth.

It is well-known in the prior art that the <111> and <100> crystal orientations, the dislocations are removed in the growth process because the <111> planes on which they lie terminate on the surface of the stem portion of the crystal before they can multiply and propagate to other planes. Thus, the <110> direction of growth has at least one additional difficulty beyond those in <111> and <100> growth, there existing planes on which dislocations can lie parallel to the growth direction. Also, there is a preference for the dislocations to lie in any of three <110> directions in each of the {111} planes parallel to the <110> growth axis, so that there is an energy barrier to overcome to divert such dislocations away from the <110> growth axis.

Briefly, in accordance with the present invention, there is provided a method for providing silicon crystals with <110> orientation having high yield as compared with the yields of the prior art methods. Briefly, in accordance with the method, dislocations parallel to the growth axis are made to grow away from the axis under the influence of a changing thin diameter. Continual enlarging and diminishing of the stem diameter causes the dislocations to be moved away from the axis and ultimately to move sufficiently far from the axis until they terminate upon an edge of the crystal and therefore disappear. Though the number of dislocations increases due to the diameter change, it has been found that the rate of discontinuity increase is less than the rate of removal of discontinuities by this method. It is therefore possible to provide silicon crystals of <110> orientation having relatively high yield and which are substantially dislocation-free.

It is therefore an object of this invention to provide a method for providing dislocation-free growth of silicon crystals of <110> orientation with relatively high yield.

It is a further object of this invention to provide dislocation-free growth of silicon crystals with <110> orientation by providing continual and alternately enlarged and diminished diameter areas in the crystal stem during crystal growth.

It is a further object of this invention to provide a high yield dislocation-free growth of silicon crystals with <110> orientation by causing the dislocations on planes parallel to the stem axis to be continually diverted away from the axis until they finally terminate on an edge of the crystal.

The above objects and still further objects of the invention will become apparent to those skilled in the art after consideration of the following preferred embodiment thereof, which is provided by way of example and not by way of limitation, wherein.

Figures 1, 2, 3:
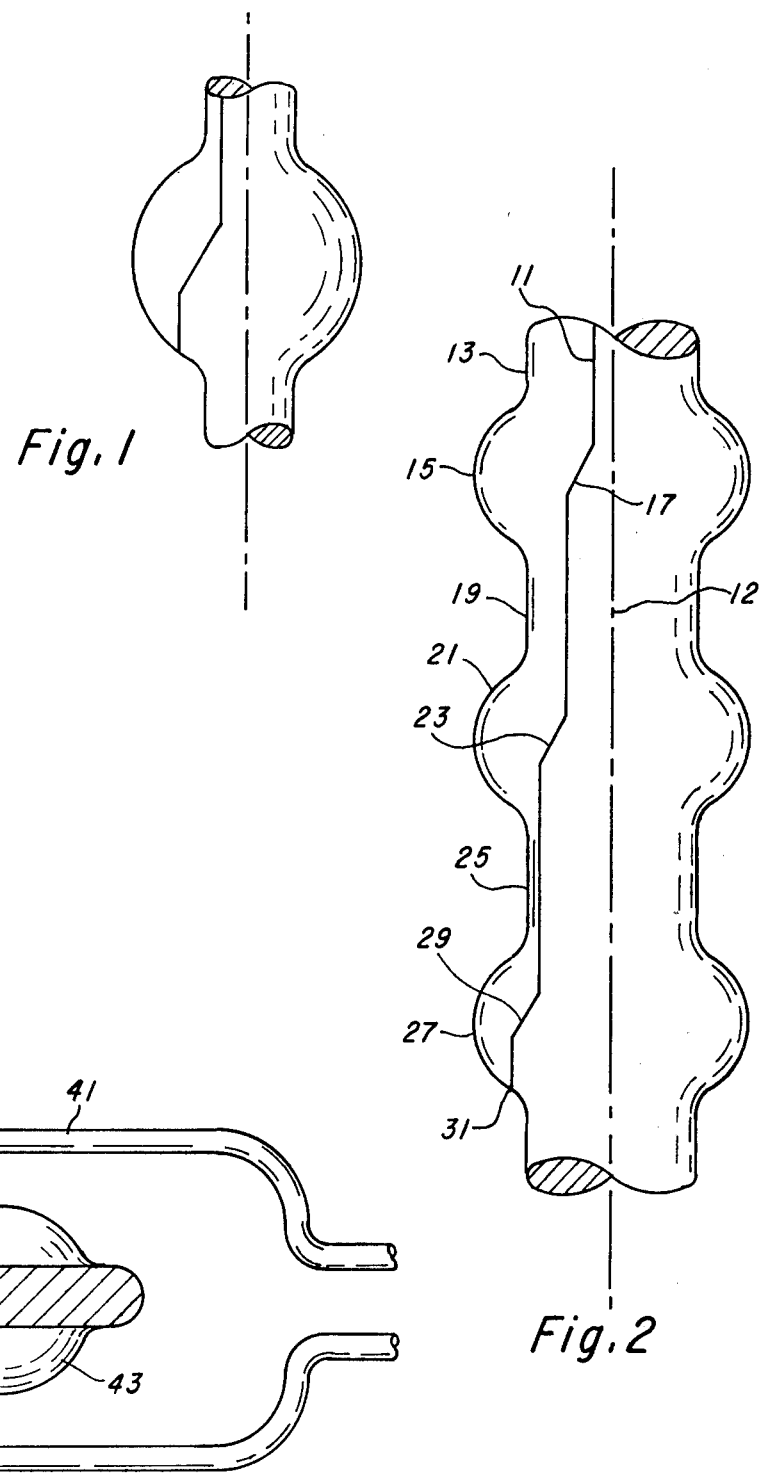
FIG. 1 shows a mechanism of removing residual dislocations in a <110> silicon growth by a single widening and thinning of the stem of the grown crystal.
FIG. 2 shows a mechanism for removing residual dislocations in <110> silicon growth by utilizing a plurality of widening and narrowing operations on the stem of the grown crystal for removing the dislocations.
FIG. 3 is a schematic diagram of a construction for allowing termination of dislocations in the <110> silicon growth on the edge of the crystal utilizing an RF coil to distort the shape of the original melt cross section.

In accordance with the present invention, the stem portion of the silicon crystal during crystal growth is controlled so that it has first a long thin portion to remove dislocations on {111} planes that are inclined to the <110> axis and a portion in which the residual dislocations are permitted to terminate at a surface. The latter portion may be generated in several ways. One way is to follow the long narrow portion with a section of substantially larger diameter followed by a narrow portion. This combination may be repeated one or more times to insure freedom from dislocations in the resulting crystal. According to this method, the residual dislocations on {111} planes parallel to the <110> axis are attracted to or change direction toward the periphery of the crystal. Then, a reduction in diameter allows the dislocations on {111} planes that are parallel to the growth axis to terminate where the {111} planes of conformity terminate on a surface. Such an operation is shown in FIG. 1 wherein a residual dislocation on a plane parallel to the <110> growth axis 2 is numbered 1. This dislocation 1 travels parallel to the axis of the crystal in the narrow stem portion 3. As the crystal diameter is enlarged in the region 5, the dislocation growth or movement is away from the axis 2 of the crystal and toward the surface thereof. When the diameter of the crystal ceases to be enlarged, such as at the midpoint of the enlarged diameter portion 5, the dislocation again travels parallel to the axis of the crystal and terminates at the edge 7, this causing removal of dislocation farther along the crystal.

Referring now to FIG. 2, there is shown a method wherein several variations in diameter are required. Here, a dislocation 11 is traveling parallel to the <110> growth axis 12 in the narrow stem portion 13. The diameter of the crystal is then enlarged in the region 15 and causes the discontinuity 11 to alter its path away from the axis 12 of the crystal. This movement is shown at the region 17. When the diameter of the crystal is again reduced at the region 19, the dislocation again travels parallel to the axis of the crystal, but closer to the edge thereof. It can be seen that the movement of the dislocation toward the surface at this point has not been sufficient to cause termination thereof on an edge. A further enlargement of the cross-section in the region 21 again causes the path of the dislocation to travel closer to the edge of the crystal along the path 23 and then travel parallel to the axis of the crystal again as the crystal diameter is narrowed in the region 25. The crystal diameter is again enlarged at the region 27, causing the path of the dislocation in the region 29 to again be moved toward the edge of the crystal and finally terminate in the edge of the crystal at the point 31. It can be seen in accordance with the method depicted in FIG. 2 that several steps of enlarging and narrowing of the crystal cross-sections are required to gradually move the path of propagation of the dislocation away from the axis of the crystal and toward the edge to provide ultimate termination of the dislocation in the surface of the crystal.

The method depicted in FIG. 2 can be accomplished in another manner, this being to shift the solid portion of the stem relative to the liquid portion one or more times during the stem growth procedure. This produces jogs in the stem portion which will automatically provide places for termination of the dislocations.

Referring now to FIG. 3, there is shown another embodiment of the invention, wherein an RF coil 41 surrounds the crystal 43 which is being pulled from the melt. The crystal 43 shown in phantom is heated by the RF coil, whereby the cross-section thereof is constricted as shown by the crystal 45. This constriction and subsequent thickening of the crystal stem will cause dislocations to move away from the axis in the same manner as shown in FIG. 1 or at several points as shown in FIG. 2 to move the path of the dislocation away from the axis of the crystal so that it finally terminates at an edge and is removed.

It can be seen that in accordance with the methods set forth hereinabove, there are provided dislocation-free silicon crystals with <110> orientation, which can be produced with relatively high yield as compared to prior art methods.

In a specific example, a <110> silicon crystal was grown which was dislocation-free in which the stem section had, first, a 28 millimeter-long thin portion of about two and a half millimeter diameter and then a portion of maximum diameter of about 8 to 9 millimeters followed by a section which was narrowed to two and a half millimeters. The stem was divided into sections and these were mechanically lapped, chemically polished and etched for dislocations. It was found that after the first narrow section of the stem only two dislocations remained. These were located at 0.7 millimeters from the center and continued to the top of the third section where the stem was starting to bulge and were located 1.0 millimeter from the center. At the bottom of the third section the dislocations had multiplied to five, but were 1.4 millimeters from the center. At the top of the fourth narrowing down section, these five dislocations continued and were one and a half millimeters from the center on the average. Only two remained at the bottom of this section and they were very close to the edge of the crystal. They were 1.3 millimeters from the center. At the top of the fifth section, only one dislocation remained at 1.0 millimeter from the center, close to the edge. At the bottom of this section, no dislocations were present and all the remaining sections were dislocation-free.

From this example, it is clear that the method described above was effective in allowing the residual dislocations to terminate even though they had multiplied from 2 to 5 in going through the bulged area.

Though the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

What is claimed is:

1. In a method of forming silicon crystals with <110> crystallographic orientation, which comprises the steps of:

pulling a <110> crystal silicon stem having a long thin portion from a silicon melt, said crystal having a first diameter and dislocations propagating in a direction substantially parallel to the stem axis, said portion being sufficiently long to remove dislocations on {111} planes that are inclined to the <110> axis.

the improvement comprising (a) enlarging said crystal stem to a second diameter sufficiently great to divert the dislocation propagation path away from the stem axis, b. then reducing said crystal stem to a third diameter sufficiently small to cause said dislocation to terminate at a crystal edge, and then c. growing the remainder of the crystal.

2. A method as set forth in claim 1 wherein steps (a) and (b) are repeated until substantially all dislocations are terminated at a crystal edge.

* * * * *